United States Patent [19]

Troost et al.

[11] Patent Number: 4,980,899

[45] Date of Patent: Dec. 25, 1990

[54] METHOD AND APPARATUS FOR SYNCHRONIZATION OF A CLOCK SIGNAL GENERATOR PARTICULARLY USEFUL IN A DIGITAL TELECOMMUNICATIONS EXCHANGE

[75] Inventors: Marcel-Abraham Troost; Wolfram Ernst; Franz Lindwurm, all of Munich, Fed. Rep. of Germany

[73] Assignee: Siemens AG, Fed. Rep. of Germany

[21] Appl. No.: 358,977

[22] Filed: May 26, 1989

[30] Foreign Application Priority Data

Jun. 21, 1988 [DE] Fed. Rep. of Germany ....... 3820916

[51] Int. Cl.$^5$ .............................................. H04L 7/00
[52] U.S. Cl. ...................................... 375/108; 331/18; 375/120
[58] Field of Search ................... 375/108, 120; 331/18

[56] References Cited

U.S. PATENT DOCUMENTS

| | | | |
|---|---|---|---|
| 3,795,872 | 3/1974 | Napolitano et al. ............ | 375/108 X |
| 4,301,537 | 11/1981 | Roos ................................ | 375/108 X |
| 4,633,193 | 12/1986 | Scorolo ........................... | 375/108 X |
| 4,849,993 | 7/1989 | Johnson et al. ..................... | 375/108 |

Primary Examiner—Benedict V. Safourek
Assistant Examiner—T. Bocure
Attorney, Agent, or Firm—Lawrence C. Edelman

[57] ABSTRACT

A method and apparatus for synchronization of a clock generator, especially a clock generator of a digital telecommunications exchange. When there is a brief outage of the reference frequency, the voltage controlled oscillator of the phase control circuit whose output frequency determines the frequency of the clock generator continues to operate with the control voltage prevailing until then. Upon resumption of the reference frequency, the phase difference between the reference frequency and the output frequency of the oscillator is measured and corrected with the value of the valid phase difference before the loss of the reference frequency. The corrected value is used as the basis for resumed frequency control.

2 Claims, 3 Drawing Sheets

METHOD AND APPARATUS FOR SYNCHRONIZATION OF A CLOCK SIGNAL GENERATOR PARTICULARLY USEFUL IN A DIGITAL TELECOMMUNICATIONS EXCHANGE

BACKGROUND OF THE INVENTION

1. Field of the Invention

The invention concerns a method and apparatus for synchronization of a clock signal generator.

2. Description of the Prior Art

In synchronous digital telecommunications exchange systems, the individual exchanges are synchronized from a central standard frequency installation which is at the highest hierarchy level of the system. The central clock generators of the individual digital exchanges are therefore synchronized to a signal reference frequency which is transmitted by a network center of a higher order or the same order, and provisions are made to keep the reference frequency ready for use in the system by way of an alternative route to which it is possible to automatically switch to in the event of trouble.

The reference frequencies are transmitted by way of existing digital signal connections to the respective exchanges, where they are extracted from the incoming digital signal currents. The reference frequencies are thus subject to high-frequency and low-frequency phase fluctuations (jitter and drift).

Phase control circuits of the central clock generators in the individual exchanges, which are responsible for synchronization to a reference frequency, are designed in such a way that they eliminate the high-frequency periodic phase fluctuations (jitter). They take into account the low-frequency phase fluctuations (drift) in frequency regulation of the clock generator, so they act as a low pass filter with regard to the phase fluctuations. Elimination of the high-frequency periodic phase fluctuations is then accomplished by averaging over certain periods of time.

With longer-lasting interruptions in the reference frequency arriving at an exchange, the frequency is switched to a different reference frequency which is supplied from another exchange on an alternative route as mentioned above. If the interruptions in the reference frequency are of only brief duration, e.g., shorter than 2 minutes, however, no such switch is made and the original reference frequency is used again for synchronization after it returns. In the time during which the reference frequency is out, the clock generator is free running, although this does not lead to any significant synchronization errors because of the relatively high stability of the clock generator and the brief interruption time assumed here. However, because of the above-mentioned periodic phase fluctuations, there may be some phase displacement when restarting, and this effect can be cumulative when such restarting is repeated. In combination with jitter, this is the case when recurrence of the reference clock signal takes place at the time of a maximum in this high-frequency phase fluctuation, so there is a sudden phase shift in comparison with the average phase prevailing before the outage. In order for the drift in the reference clock frequency not to lead to a synchronization error due to the interruption and resumption, care must be taken to assure that the long-term phase relationship existing between the signal at the output and the input of the controller at the moment of the interruption is preserved.

A known circuit arrangement, which takes into account both aspects so it assures that the aforementioned phase relationship is maintained while also preventing the control system from locking on an extreme jitter value, is shown in FIG. 1. Upstream from the actual controller (PLL2) of this arrangement, which synchronizes the clock frequency $f_n$ to the reference frequency $f_R$, there is a second controller (PLL1) whose function is to filter out the high-frequency jitter of the reference frequency $f_R$. This arrangement also has a number of frequency dividers, as a result of which, at an output frequency $f_n$ of 4096 kHz a phase comparison is performed at 4kHz by the second controller (PLL1) and a phase comparison at 64 kHz is performed by the actual controller (PLL2). If the reference frequency $f_R$ is lost, controller (PLL2) is short circuited with the help of switch S, so the phase position at the controller output does not change during the outage time.

With the help of this arrangement, occurrence of an error in synchronization which is possible due to the drift in the reference frequency is largely avoided, but there is a locking error here of 1/4096 kHz=244 ns because of the jitter in returning to the normal state. Because of the difference in free running properties of the two phase control circuits (PLL1) and (PLL2) this locking error tends in one direction so it is cumulative when the switching operations are repeated several times. The purpose of the present invention is to greatly improve the process for synchronization of a clock generator of the type defined initially so that such errors can largely be avoided in the case of loss and resumption of the reference frequency.

SUMMARY OF THE INVENTION

A method and apparatus for synchronizing a clock signal generator, especially a clock signal generator of a digital telecommunications exchange.

When there is a brief outage of the reference frequency, the voltage controlled oscillator of the phase control circuit whose output frequency determines the frequency of the clock generator continues to operate with the control voltage prevailing just before the outage. Upon resumption of the reference frequency, the phase difference between the reference frequency and the output frequency of the oscillator is measured and corrected with the value of the valid phase difference before the loss of the reference frequency. The corrected value is used as the basis for resumed frequency control.

Other features and advantages of the invention will be apparent from the description of the preferred embodiment, and from the claims.

For a fuller understanding of the present invention, reference should now be made to the following detailed description of the preferred embodiment of the invention and to the accompanying drawing.

DETAILED DESCRIPTION OF THE PREFERRED EMBODIMENTS

Figure 1:
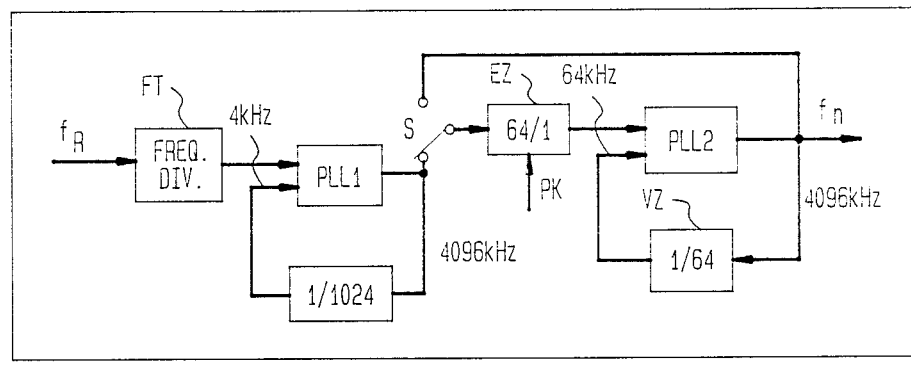
FIG. 1 shows the above-mentioned arrangement for clock synchronization.
Figure 2:
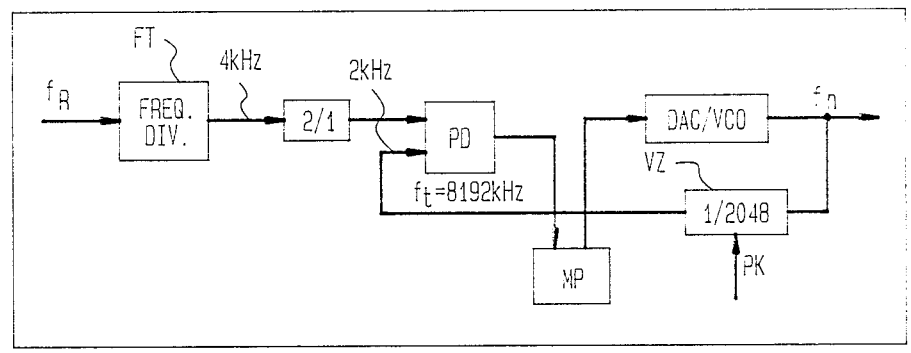
FIG. 2 shows an arrangement for clock synchronization that operates by the process according to this invention.

By means of a frequency divider FT of the arrangement according to FIG. 2, the reference frequency $f_R$ to which the clock frequency $f_n$ delivered by a voltage controlled oscillator VCO is to be synchronized is divided down to a frequency of 2 kHz and sent to one input of a phase discriminator PD. The other input of the phase discriminator receives a frequency which is also divided down to 2 kHz by another frequency divider VZ from a clock frequency of 4096 kHz.

The above-mentioned phase discriminator PD, the voltage controlled oscillator VCO with a digital-analog converter DAC connected in series with it and a microprocessor MP form a phase locked loop (PLL) control circuit, whose operation in carrying out the process according to this invention is described in detail below.

With the help of microprocessor MP, phase averaging of the phase differences between the reference frequency $f_R$ and the clock frequency $f_n$ as determined by the phase discriminator PD is performed over a control cycle of, for example, 8.192 seconds in order to filter out the jitter from the reference frequency $f_R$. The average value obtained in such a control cycle is stored in microprocessor MP throughout the following cycle in the event of no disturbance.

On the basis of the low-frequency phase fluctuations in the reference frequency and on the basis of the phase differences due to the fact that the clock frequency $f_n$ delivered by the voltage controlled oscillator VCO deviates from the frequency of the reference frequency $f_R$, microprocessor MP determines a control value for the oscillator VCO which corresponds to the actual phase relationship.

If the reference frequency is lost (due to an outage), which is sensed by the microprocessor MP as a response to the input from the phase discriminator PD, the control value which has been current up until that point is retained so the phase value of the clock frequency $f_n$ does not change. Furthermore, the above-mentioned averaged phase value of the last concluded measurement period remains stored.

If the reference frequency returns within a predetermined period of time, justifying not switching to another reference frequency, which is also sensed by the microprocessor MP as a response to he resumed input from the phase discriminator PD, then the phase discriminator is set at averaging and the measurement cycle is started at T for a period long enough that the current phase deviation in the clock frequency $f_n$ from the reference frequency $f_R$ determined in it has a sufficiently small residual error corresponding to the transmission function of averaging $H = 1/(\pi \cdot T \cdot f_j)$. The value of this phase deviation is then corrected by the value of the phase deviation determined until loss of the reference frequency and stored as indicated. This corrected value is then assigned to the remaining control process as an offset value.

Figure 3:
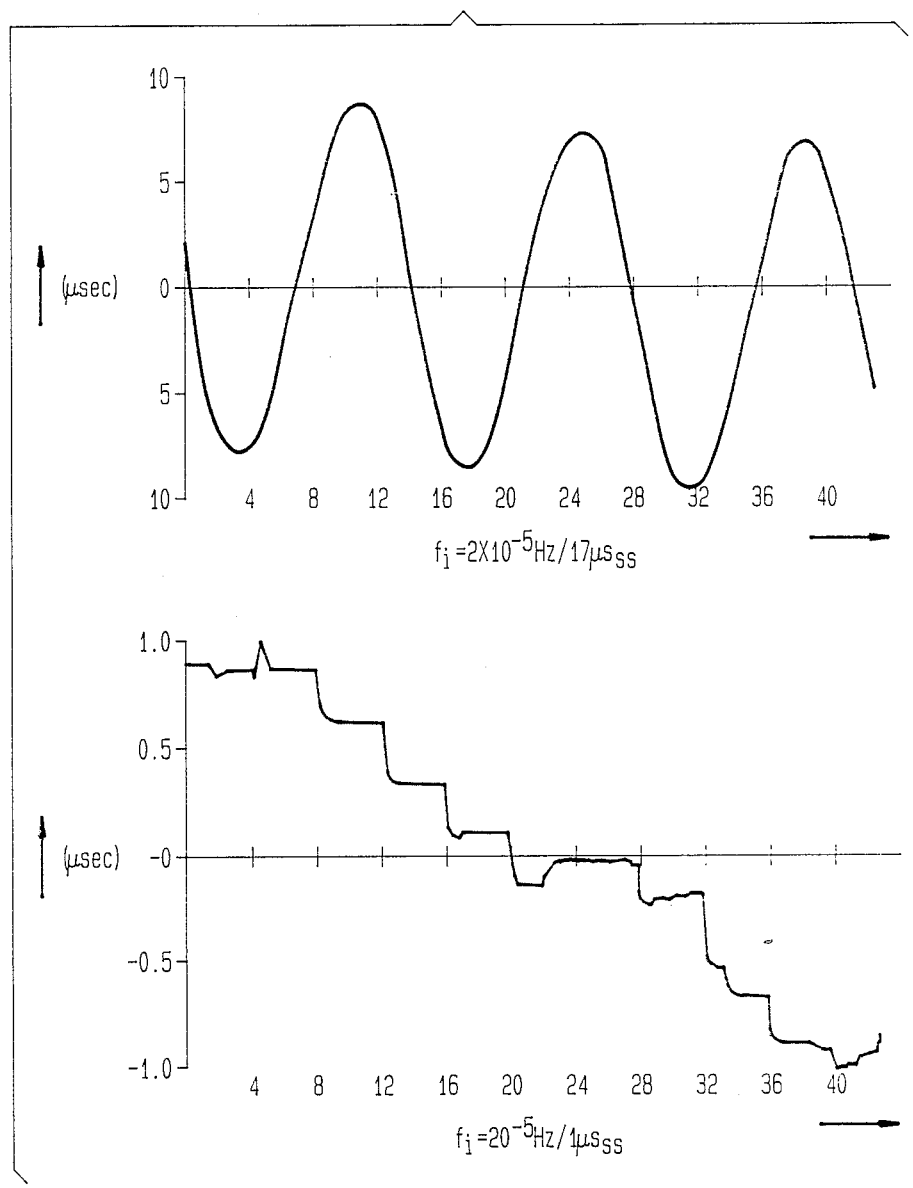
FIGS. 3 and 4 show time diagrams which illustrate the locking error in the arrangements according to FIGS. 1 and 2.
Figure 4:
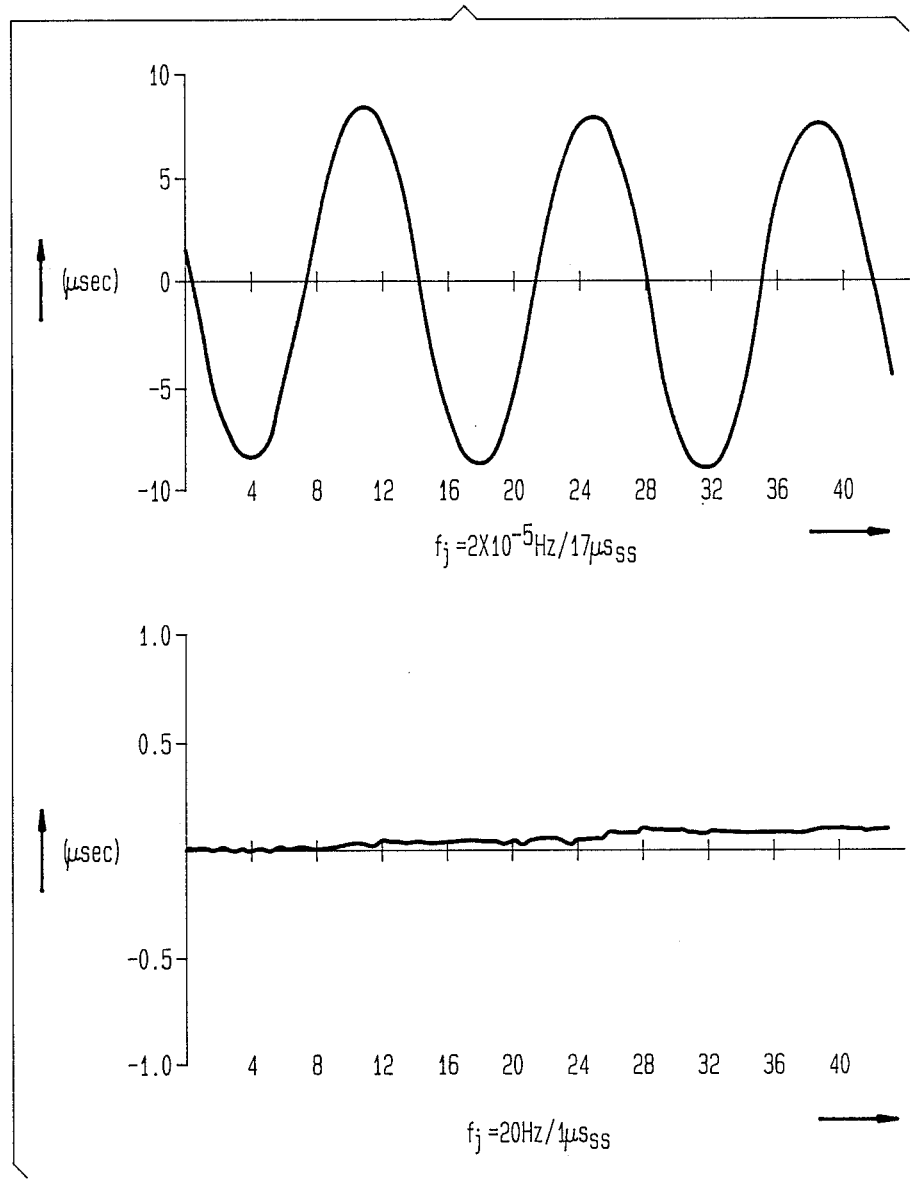

As shown by a comparison of FIGS. 3 and 4, where in the case of FIG. 3 the effects of the above-mentioned locking error over a period of about 50 hours with reference frequency interruptions of 90 seconds each at intervals of 4 hours are shown, and where FIG. 4 shows the relationships when using a process according to this invention with a measurement cycle of 16.3845 under the same condition, the process according to this invention, can be seen to yield a substantial reduction in cumulative error.

Thus, there has been shown and described a novel method and apparatus for synchronization of a clock generator which fulfills all the objects and advantages sought therefore. Many changes, modifications, variations and other uses and applications of the subject invention will, however, become apparent to those skilled in the art after considering this specification and the accompanying drawings which disclose a preferred embodiment thereof. All such changes, modifications, variations and other uses and applications which do not depart from the spirit and scope of the invention are deemed to be covered by the invention which is limited only by the claims which follow.

We claim:

1. A method for providing an output clock frequency by synchronizing a local clock frequency of a local clock signal generator to a reference frequency of an input reference frequency signal that is subject to periodic phase fluctuations (jitter and drift) during transmission, wherein said reference frequency signal is subject to interruptions of varying duration, said method comprising the steps of:

(a) comparing the input reference frequency to the local clock frequency;

(b) using a digital microprocessor responsive to said comparing step to determine an average phase deviation value between the input reference frequency and the local clock frequency over a period of time T of duration such that any error caused by high-frequency periodic phase fluctuations (jitter) is sufficiently small, and storing the determined average phase deviation value;

(c) outputting a control signal from said digital microprocessor to a voltage controlled oscillator in order to generate an output clock frequency, said control signal being based upon the reference frequency corrected with the average phase deviation value, and using the output clock frequency via a phase-locked loop (PLL) to control the local clock frequency used in said comparing step (a);

(d) sensing when there is an interruption in the input reference frequency, and continuing to output the control signal from said microprocessor which was prevailed up to the time of the interruption in order to continue to generate the output clock frequency; and (e) sensing a resumption of the input reference frequency within a given period of time which does not require switching to another reference frequency, and using the stored average phase deviation value which was prevailing up to the time of the interruption and stored during the interim to correct the control signal provided in said outputting step (d) above as a basis for resuming control of the phase fluctuations of the input reference frequency.

2. An apparatus for providing an output clock frequency by synchronizing a local clock frequency of a local clock signal generator to a reference frequency of an input reference frequency signal that is subject to period phase fluctuations (jitter and drift) during transmission, wherein said reference frequency signal is subject to interruptions of varying duration, said apparatus comprising:

(a) a phase discriminator for comparing the input reference frequency to the local clock frequency;

(b) a digital microprocessor responsive to a comparison output of said phase discriminator for determining an average phase deviation value between the input reference frequency and the local clock frequency over a period of time T of a duration such that any error caused by high-frequency periodic phase fluctuations (jitter) is sufficiently small, and for outputting a control signal based upon the reference frequency corrected with the determined average phase deviation value, said microprocessor including means for storing the determined average phase deviation value;

(c) a voltage controlled oscillator responsive to said control signal from said microprocessor for generating an output clock frequency;

(d) a phase-locked loop (PLL) using the output clock frequency to control the local clock frequency provided as an input to said phase discriminator; and (d) said microprocessor being operated to sense when there is an interruption in the input reference frequency, and continuing to output the control signal which was prevailing up to the time of the interruption in order to continue to generate the output clock frequency, and also being operated to sense a resumption of the input reference frequency within a given period of time which does not require switching to another reference frequency, and using the stored average phase deviation value which was prevailing up to the time of the interruption and stored during the interim to correct its control signal as a basis for resuming control of the phase fluctuations of the input reference frequency.

* * * * *